US012783451B2

(12) United States Patent
Fang et al.

(10) Patent No.: US 12,783,451 B2
(45) Date of Patent: *Nov. 3, 2026

(54) COMMUNICATION SYSTEM BETWEEN DIES AND OPERATION METHOD THEREOF

(71) Applicants: Global Unichip Corporation, Hsinchu (TW); Taiwan Semiconductor Manufacturing Company, Ltd., Hsinchu (TW)

(72) Inventors: Yung-Sheng Fang, Hsinchu (TW); Igor Elkanovich, Hsinchu (TW); Pei Yu, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 76 days.

This patent is subject to a terminal disclaimer.

(21) Appl. No.: 19/091,848

(22) Filed: Mar. 27, 2025

(65) Prior Publication Data

US 2025/0225101 A1 Jul. 10, 2025

Related U.S. Application Data

(62) Division of application No. 18/322,537, filed on May 23, 2023, now Pat. No. 12,292,850.

(51) Int. Cl.
*G06F 13/42* (2006.01)
*H04B 1/50* (2006.01)
(Continued)

(52) U.S. Cl.
CPC .. *G06F 13/4282* (2013.01); *G06F 2213/0002* (2013.01); *H10W 70/611* (2026.01); *H10W 90/00* (2026.01); *H10W 90/401* (2026.01)

(58) Field of Classification Search
CPC .................................. G06F 13/00; H04L 7/00
See application file for complete search history.

(56) References Cited

U.S. PATENT DOCUMENTS 11,411,560 B1 * 8/2022 Yu .................. H03K 19/017509
2007/0170970 A1 * 7/2007 Isono .................... H04L 7/0008
327/295

(Continued)

*Primary Examiner* — Getente A Yimer
(74) *Attorney, Agent, or Firm* — JCIPRNET

(57) ABSTRACT

A die-to-die communication system and an operation method thereof are provided. The die-to-die communication system includes a transmitting device disposed at a first die and a receiving device disposed at a second die, wherein the first die and second die are disposed in a same integrated circuit package. The receiving device is coupled to the transmitting device via a communication interface. The transmitting device transmits a data unit stream to a data channel in the communication interface. The receiving device receives the data unit stream from the data channel in the communication interface. The receiving device returns transmission management information to the transmitting device via a feedback channel different from the data channel in the communication interface. In various embodiments, the transmission management information includes flow control information and/or error replay information. Based on the transmission management information, the transmitting device manages the data unit stream in the data channel.

20 Claims, 12 Drawing Sheets

(51) Int. Cl.
*H10W 70/60* (2026.01)
*H10W 90/00* (2026.01)

(56) References Cited

U.S. PATENT DOCUMENTS

2008/0225842 A1* 9/2008 Goldfein ............... H04L 1/1825
370/389
2023/0032605 A1* 2/2023 Liu ......................... H04L 47/62

* cited by examiner

300

| | | | | | | | | | | | | | | |
|---|---|---|---|---|---|---|---|---|---|---|---|---|---|---|
| VSS | T_D0 | T_D7 | T_D11 | VDDP | T_PAR | T_D26 | T_FC1 | VSS | R_D25 | R_D19 | R_D15 | VDDP | R_D6 | R_DBI3 |
| T_DBI0 | T_D1 | VSS | T_D12 | T_D16 | T_D20 | VDDP | T_FC0 | R_D29 | R_D24 | VSS | R_D14 | R_D10 | R_D5 | VDDP |
| VDDP | T_LR0 | T_D8 | T_FR | VSS | T_D21 | T_D27 | T_D30 | VDDP | R_LR1 | R_D18 | R_D13 | VSS | R_D4 | R_DBI2 |
| T_DBI1 | T_D2 | VDDP | T_DCKP | T_D17 | T_D22 | VSS | T_D31 | R_D28 | R_D23 | VDDP | R_DCKN | R_D9 | R_D3 | VSS |
| VSS | T_D3 | T_D9 | T_DCKN | VDDP | T_D23 | T_D28 | R_D31 | VSS | R_D22 | R_D17 | R_DCKP | VDDP | R_D2 | R_DBI1 |
| T_DBI2 | T_D4 | VSS | T_D13 | T_D18 | T_LR1 | VDDP | R_D30 | R_D27 | R_D21 | VSS | R_FR | R_D8 | R_LR0 | VDDP |
| VDDP | T_D5 | T_D10 | T_D14 | VSS | T_D24 | T_D29 | R_FC0 | VDDP | R_D20 | R_D16 | R_D12 | VSS | R_D1 | R_DBI0 |
| T_DBI3 | T_D6 | VDDP | T_D15 | T_D19 | T_D25 | VSS | R_FC1 | R_D26 | R_PAR | VDDP | R_D11 | R_D7 | R_D0 | VSS |

FIG. 5

COMMUNICATION SYSTEM BETWEEN DIES AND OPERATION METHOD THEREOF

CROSS-REFERENCE TO RELATED APPLICATION

This application is a divisional application of and claims the priority benefit of a prior application Ser. No. 18/322,537, filed on May 23, 2023. The entirety of the above-mentioned patent application is hereby incorporated by reference herein and made a part of this specification.

BACKGROUND OF THE INVENTION

Field of the Invention

The invention relates to a communication system, and more particularly to a communication system between dies and an operation method thereof.

Description of Related Art

Digital electronic equipment based on semiconductor integrated circuits, such as mobile phones, digital cameras, personal digital assistants (PDAs), etc., are designed to have more powerful functions to adapt to various applications in the modern digital world. However, with the trend of semiconductor manufacturing, digital electronic equipment are becoming smaller and lighter, as well as having improved functionality and higher performance. Semiconductor integrated circuits may be packaged into 2.5 D integrated circuits, that is, several dies may be disposed in the same integrated circuit package. Contact elements, interposer layers, or redistribution layers (RDLs) are used to make connections between different dies. Integrated fan-out (InFO) and chip-on-wafer-on-substrate (CoWoS) packaging techniques may be used to package a plurality of chips/dies assembled side by side.

One die may need to be electrically connected to one or a plurality of dies in the same IC package. Communication takes place between different dies. A transmitting device (one of the dies) may transmit data to a receiving device (another die) via a communication interface. In any case, due to noise interference or other factors, the data received by the receiving device from the communication interface may be wrong. Alternatively, the data may be received/processed by the receiving device at a different rate than the data sent by the transmitting device. How to manage the data unit stream transmitted from the transmitting device to the receiving device in real time and effectively is one of many technical issues.

SUMMARY OF THE INVENTION

The invention provides a die-to-die communication system and an operation method thereof to manage a data unit stream transmitted between different dies in real time.

In an embodiment of the invention, the die-to-die communication system includes a first transmitting device and a first receiving device. The first transmitting device is disposed at a first die, and the first receiving device is disposed at a second die, wherein the first die and second die are disposed in a same integrated circuit package. The first receiving device is coupled to the first transmitting device via a communication interface. The first transmitting device is used to transmit a first data unit stream to a data channel in the communication interface. The first receiving device receives the first data unit stream from the data channel in the communication interface. The first receiving device returns transmission management information to the first transmitting device via a feedback channel different from the data channel in the communication interface. Based on the transmission management information, the first transmitting device manages the first data unit stream in the data channel. The feedback channel comprises a first dedicated wire dedicated to reflect that a current data unit is an error. When the current data unit received by the first receiving device is an error, the first receiving device notifies the first transmitting device to retransmit the current data unit via the first dedicated wire.

In an embodiment of the invention, the operation method includes: transmitting a first data unit stream to a data channel in a communication interface by a transmitting device disposed at a first die; receiving the first data unit stream from the data channel in the communication interface by a first receiving device disposed at a second die, wherein the first die and the second die are disposed in a same integrated circuit package, and the first receiving device is coupled to the first transmitting device via the communication interface; returning transmission management information to the first transmitting device via a feedback channel different from the data channel in the communication interface by the first receiving device, wherein the feedback channel comprises a first dedicated wire dedicated to reflect that a current data unit is an error; managing the first data unit stream of the data channel based on the transmission management information by the first transmitting device; and notifying the first transmitting device to retransmit the current data unit via the first dedicated wire by the first receiving device when the current data unit received by the first receiving device is an error.

Based on the above, according to various embodiments of the invention, the receiving device returns the transmission management information to the transmitting device via the feedback channel different from the data channel, so the transmission bandwidth of the data channel may be not occupied by the transmission management information. Since the feedback channel is dedicated to the return of the transmission management information, the transmitting device may manage the data unit stream transmitted on the data channel in real time based on the transmission management information.

In order to make the aforementioned features and advantages of the disclosure more comprehensible, embodiments accompanied with figures are described in detail below.

BRIEF DESCRIPTION OF THE DRAWINGS

FIG. 5 is a schematic structural diagram of a contact element pattern shown according to an embodiment of the invention.

DESCRIPTION OF THE EMBODIMENTS

Figure 1:
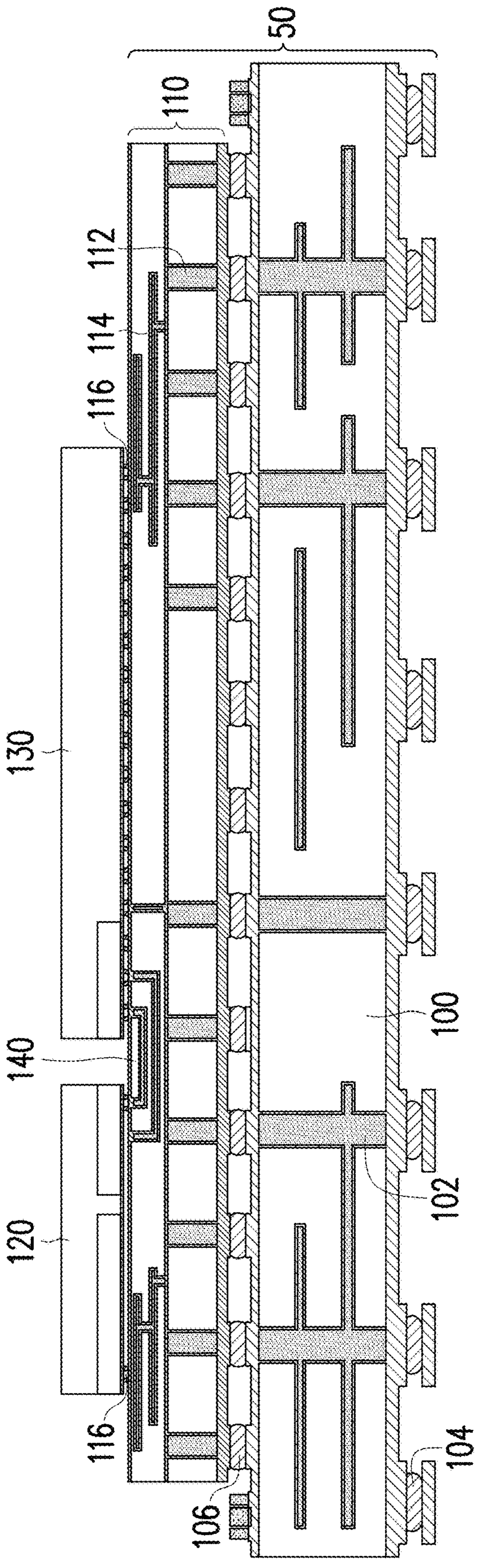
FIG. 1 is a schematic diagram of a cross-sectional stacked structure of a 2.5 D semiconductor integrated circuit having a communication interface shown according to an embodiment of the invention.

The term "coupled to (or connected to)" used in the entire text of the specification of the present application (including claims) may refer to any direct or indirect connecting means. For example, if it is described in the text that a first device is coupled (or connected) to a second device, it should be interpreted as that the first device may be directly connected to the second device, or the first device may be indirectly connected to the second device via other devices or some connection means. The terms "first" and "second" mentioned in the entire specification of the present application (including the claims) are used to name elements, or to distinguish different embodiments or scopes, and are not used to limit the upper limit or lower limit of the number of elements, nor to limit the sequence of elements. In addition, wherever possible, elements/members/steps using the same reference numerals in the drawings and embodiments represent the same or similar parts. Elements/members/steps having the same reference numerals or having the same terminology in different embodiments may be cross-referenced.

The invention relates to data transmission and management between two devices (e.g., two dies). Several embodiments are provided below to introduce the invention, but the implementation of the invention is not limited to the embodiments.

The entire integrated circuit may be manufactured into a semiconductor integrated circuit by a semiconductor manufacturing process, and the semiconductor integrated circuit may be manufactured based on a stacked structure of a 2.5 D semiconductor integrated circuit. The interface of the receiving device in the die may contain a frame decoding circuit associated with a de-serialized circuit. In some embodiments, the interface in the semiconductor structure is integrated in the entire integrated circuit.

First, semiconductor manufacture is described. FIG. 1 is a schematic diagram of a cross-sectional stacked structure of a 2.5 D semiconductor integrated circuit having a communication interface shown according to an embodiment of the invention. Please refer to FIG. 1, a chip-on-wafer-on-substrate (CoWoS) or an integrated fan-out (InFO) platform 50 having the expected integrated circuit structure is formed based on a 2.5 D packaging technique. The CoWoS or InFO platform 50 may contain a package substrate 100 having a bottom solder ball 104 and a top contact element 106. A via 102 may be used to connect from the bottom solder ball 104 to the top contact element 106. Moreover, an interposer layer or a redistribution layer (RDL) 110 may be further formed on the substrate 100, which is connected to the contact element 106. The interposer layer or the redistribution layer 110 is embedded with a routing structure 140, wherein the routing structure 140 has a routing path for connection purposes. The interposer layer or the redistribution layer 110 may further contain a through-silicon-via (TSV) 112, an interconnect wiring 114, and a contact element 116. Here, depending on the manufacturing process employed, the contact element 116 may be a via or a contact element or any suitable connection structure for terminal-to-terminal contact. The present embodiment does not limit the contact elements 106 and 116 to a particular type.

In actual application, the CoWoS or InFO platform 50 may also be implemented with an additional die, such as an application-specific integrated circuit (ASIC) die 130 and a serializer-deserializer (SerDes) die 120. The ASIC die 130 and the SerDes die 120 are connected by the routing structure 140 (the wiring 114 and the contact element 116). One ASIC die 130 may be connected with a plurality of SerDes dies 120 for various peripheral communications.

Figure 2:
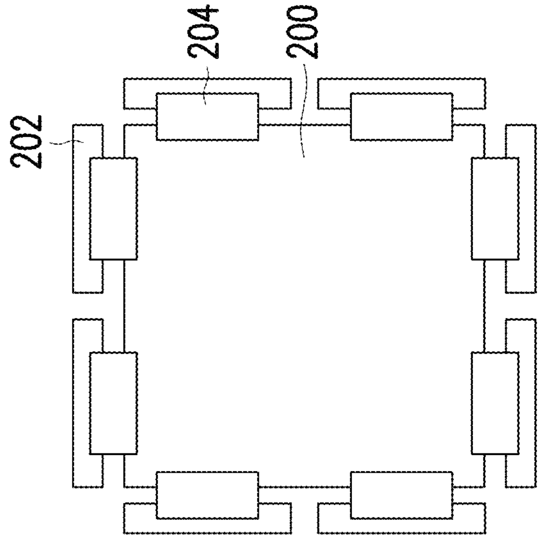
FIG. 2 is a schematic top view of one die connected to a plurality of other dies via a communication interface shown according to an embodiment of the invention.

FIG. 2 is a schematic top view of one die connected to a plurality of other dies via a communication interface shown according to an embodiment of the invention. Referring to FIG. 2, one die 200 (for example, a processor or an ASIC die) may be connected to a plurality of dies 202 via a communication interface 204, so that data may be transmitted between the die 200 and the dies 202. The communication interface 204 may contain a wiring and a contact element in a contact element pattern such that the die 200 may be connected to the dies 202.

Figure 3:
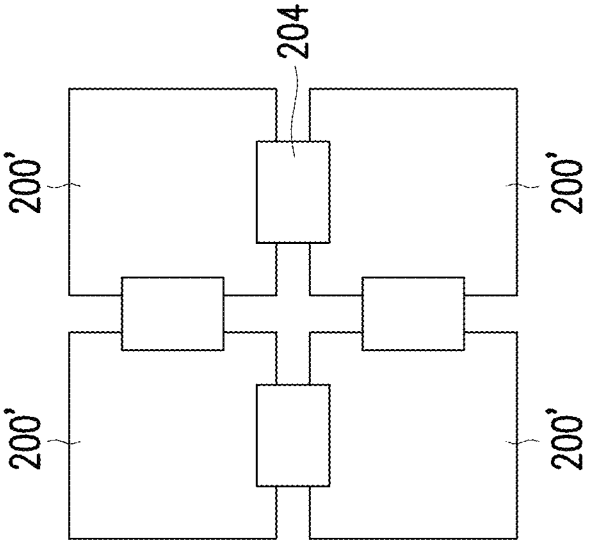
FIG. 3 is a schematic top view of a plurality of dies connected to each other via a communication interface shown according to another embodiment of the invention.

FIG. 3 is a schematic top view of a plurality of dies connected to each other via a communication interface shown according to another embodiment of the invention. Referring to FIG. 3, a plurality of processor dies 200' may be connected together to form a large processor having more powerful functions. In this case, the processor dies 200' are also connected via the communication interface 204.

As previously described, the 2.5 D packaging process may be applied to stack various dies side by side without substantially further consuming device area. However, to allow the dies to be connected together more freely, the contact elements in the communication interface 204 need to be suitably arranged in a compact manner and further be symmetrical for receiving and transmitting a signal. The communication between the two dies 200 to 202 may be readily arranged in the peripheral area. Here, the communication interface 204 may also refer to a Glink interface available in the market.

Figure 4:
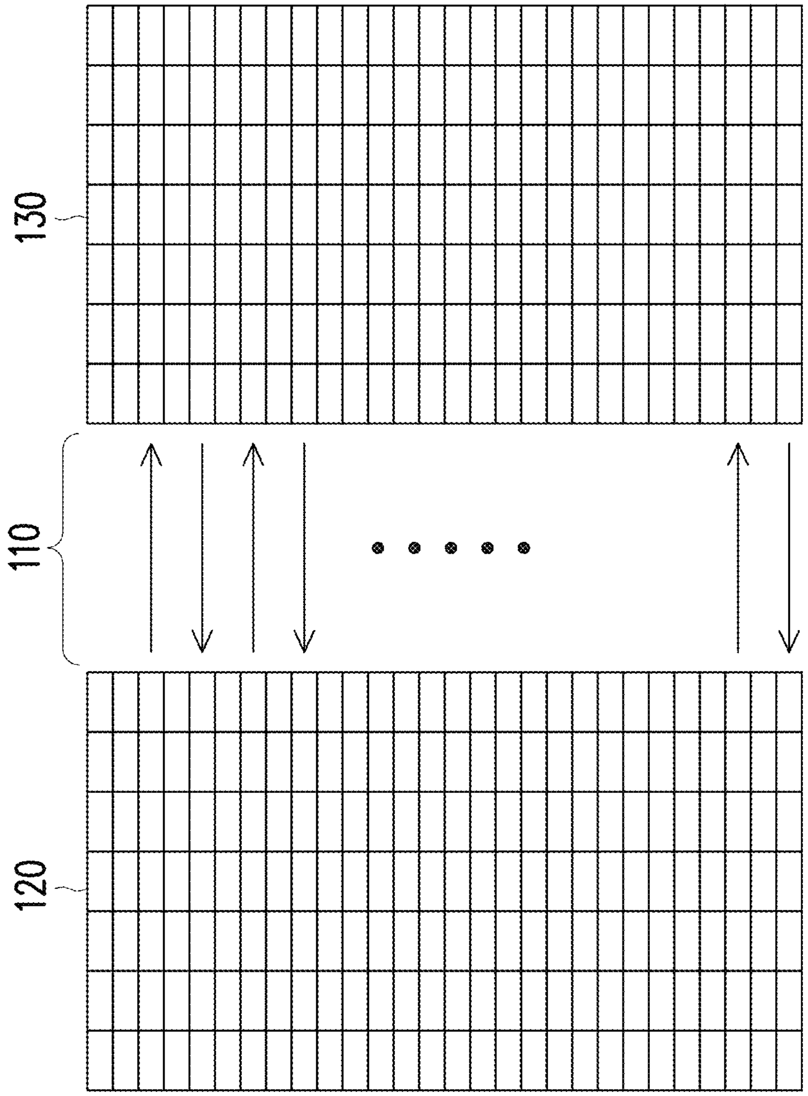
FIG. 4 is a schematic diagram of communication between two dies based on an interface having an interposer layer or a redistribution layer shown according to an embodiment of the invention.

FIG. 4 is a schematic diagram of communication between two dies based on an interface having an interposer layer or a redistribution layer shown according to an embodiment of the invention. Referring to FIG. 4, in an example, the ASIC die 130 and the SerDes die 120 communicate via an interposer layer or the redistribution layer 110. Contact elements of the ASIC die 130 and the SerDes die 120 contacting the interposer layer or the redistribution layer 110 are suitably arranged. Each contact element may simultaneously transmit a specific signal. Thus, parallel buses are created based on the contact elements. The signal at each contact element is in a serial format, such as a bit string.

FIG. 5 is a schematic structural diagram of a contact element pattern shown according to an embodiment of the invention. Please refer to FIG. 5, the total number of contact elements involved in the communication interface may be one, and signals are transmitted in parallel in the communication interface. The total number of contact elements involved in the communication interface may be a larger number. Signals are transmitted in parallel between dies. According to the size of data in one bus, the size of 32-bit data having operating voltage and other functional signals is set as a slice (refer to a contact element pattern 300). The contact element pattern 300 may be replicated in a certain number (e.g., 8) to accommodate the total data size in parallel communication. In an embodiment, the data corresponds to 32 bits having sequences R_D0 to R_D31 and T_D0 to T_D31. On the sequences, T designates a contact element for transmission and R designates a contact element for reception. In addition, the contact element pattern 300 also includes a plurality of low voltage signals VSS and a plurality of high voltage signals VDDP. Moreover, various functional signals are also contained. The functional signals contain FRAM T/R_FR, clock T/R_DCK_P/N, flow control T/R_FC [1:0], DBI T/R_DBI [3:0], parity T/R_PAR, and lane repair T/R_LR [1:0]. However, the contact elements for the functional signals are not limited to the embodiments described.

Table 1 is an example of contact elements defining one transmitting (T) group or receiving (R) group. The transmitting group and the receiving group have the same number of contact elements.

TABLE 1

| Contact element type | Number | Definition |
|---|---|---|
| Data, T/R [31:0] | 32 | Data bit synchronized with CLK |
| Frame, T/R_FRAME | 1 | FRAME bit synchronized with CLK |
| Clock, T/R_DCK_P/N | 2 | CLK differential pair |
| Flow control, T/R_FC [1:0] | 2 | Asynchronous and in different directions for data bus |
| DBI, /R_DBI [3:0] | 4 | One DBI per byte for inverting bus content for better single sign-on (SSO) |
| Parity, T/R_PAR | 1 | One per 32 bits, used to identify error conditions |
| Lane repair, T/R_LR [1:0] | 2 | Lane repair bit, used to repair data, parity, and DBI, not used to repair CLK, FRAME, and FC signals. |

Based on the interposer layer or the redistribution layer 110 described above, various signals are communicated between two dies. However, in an example, a set of parallel signals in communication may be converted to a serial format for transmission/reception via one wire having one contact element. Once a serial format data signal is received by the die, the die deserializes the data signal into a parallel format.

Figure 6:
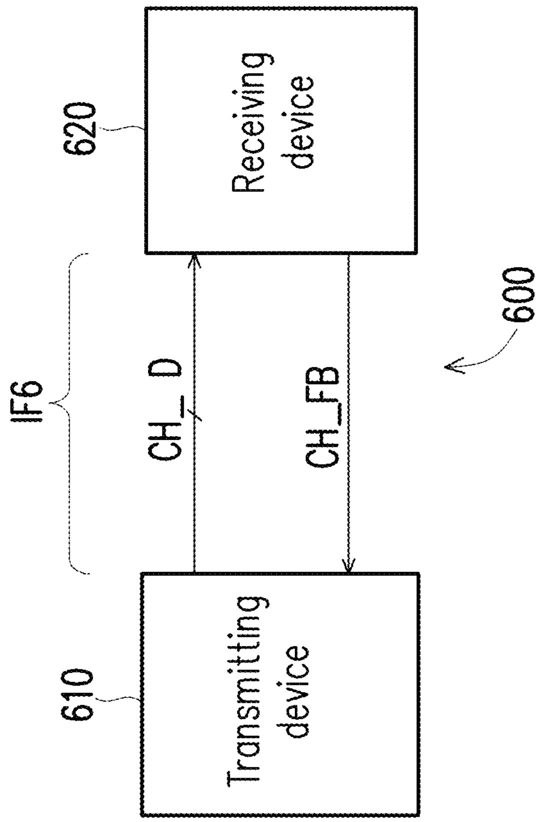
FIG. 6 is a schematic circuit block diagram of a die-to-die communication system according to an embodiment of the invention.

FIG. 6 is a schematic circuit block diagram of a die-to-die communication system 600 according to an embodiment of the invention. The die-to-die communication system 600 shown in FIG. 6 includes a transmitting device 610 and a receiving device 620. The transmitting device 610 may be disposed at one die (first die), and the receiving device 620 may be disposed at another die (second die). In particular, the first die and the second die are disposed in the same integrated circuit package, and the first die is coupled to the second die via a communication interface IF6. For example, the first die may be a SerDes die 120 and the second die may be an ASIC die 130. Or, the first die and the second die may be analogized with reference to the related descriptions of the die 200, the dies 202, and/or the processor dies 200', and the communication interface IF6 may be analogized with reference to the related descriptions of the communication interface 204.

The receiving device 620 is coupled to the transmitting device 610 via the communication interface IF6. Based on the illustrations in FIG. 1 to FIG. 5, or based on other communication techniques, the transmitting device 610 may transmit a data unit stream to the receiving device 620 via the communication interface IF6. The data unit stream includes a plurality of data units, wherein the number of bits of each data unit may be any integer determined according to actual design.

Figure 7:
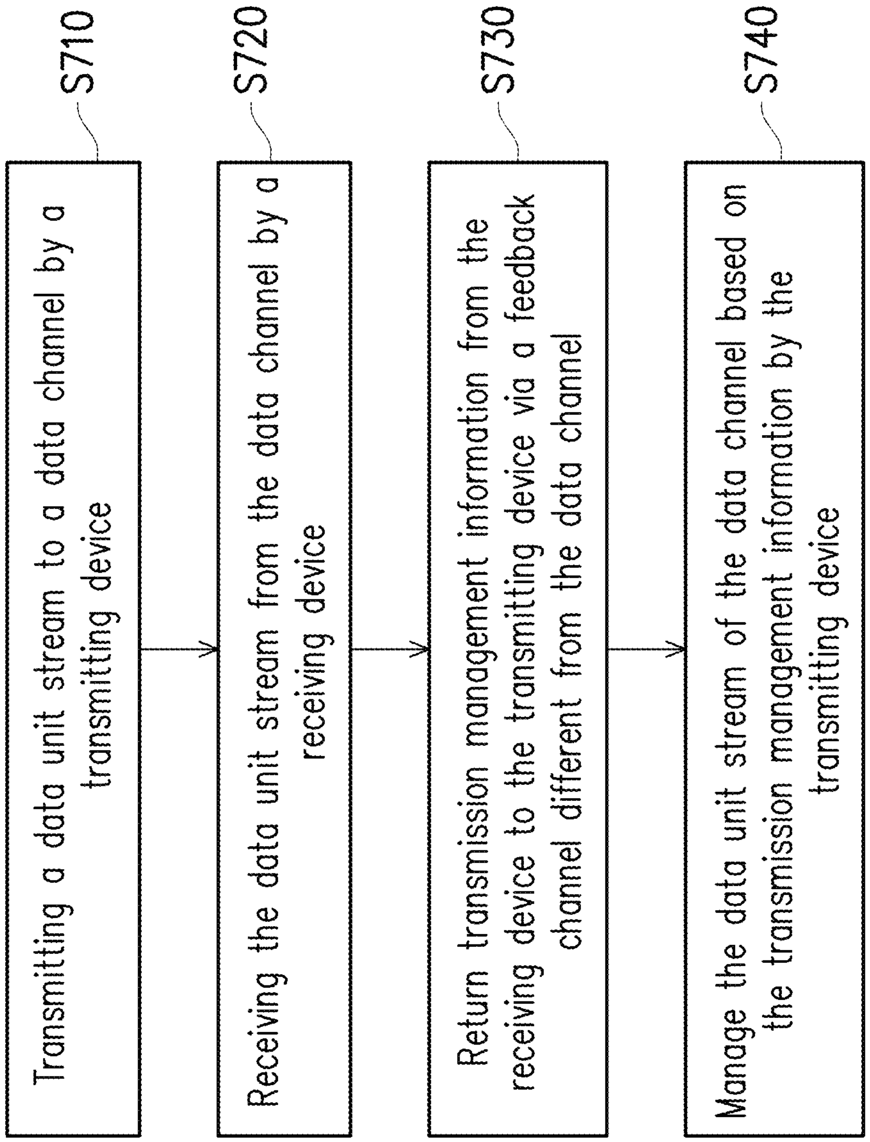
FIG. 7 is a schematic flowchart of an operation method of a die-to-die communication system according to an embodiment of the invention.

FIG. 7 is a schematic flowchart of an operation method of a die-to-die communication system according to an embodiment of the invention. Please refer to FIG. 6 and FIG. 7. In step S710, the transmitting device 610 disposed at the first die may transmit the data unit stream to a data channel CH_D in the communication interface IF6. Generally speaking, the data channel CH_D is formed by one or a plurality of wires. In step S720, the receiving device 620 disposed at the second die may receive the data unit stream from the data channel CH_D in the communication interface IF6. In step S730, the receiving device 620 may return transmission management information to the transmitting device 610 via a feedback channel CH_FB different from the data channel CH_D in the communication interface IF6. Generally speaking, the feedback channel CH_FB is formed by one or a plurality of additional wires. In step S740, the transmitting device 610 may manage the data unit stream of the data channel CH_D based on the transmission management information of the feedback channel CH_FB.

Based on the above, the transmitting device 610 transmits the data unit stream to the receiving device 620 via the data channel CH_D, and the receiving device 620 returns the transmission management information to the transmitting device 610 via the feedback channel CH_FB different from the data channel CH_D. Therefore, the transmission bandwidth of the data channel CH_D may be not occupied by the transmission management information. Since the feedback channel CH_FB is dedicated to the return of the transmission management information, the transmitting device 610 may manage the data unit stream transmitted on the data channel CH_D in real time based on the transmission management information.

The specific content of the transmission management information may be determined according to actual design and/or actual application. For example, in some embodiments, the transmission management information may include flow control information. The flow control information represents readiness of the receiving device 620 to accept data like in the case of AXI (Advanced eXtensible Interface) Slave. In other embodiments, the flow control information represents data flit credits of the receiving device 620 to accept data flits. For example, the flow control information includes the data flit credit in the CXS protocol of AMBA (Advanced Microcontroller Bus Architecture) or the data flit credit in the CHI (Coherent Hub Interface) protocol. In other embodiments, the transmission management information may include error replay information. In still other embodiments, the transmission management information may include flow control information and error replay information.

Figure 8:
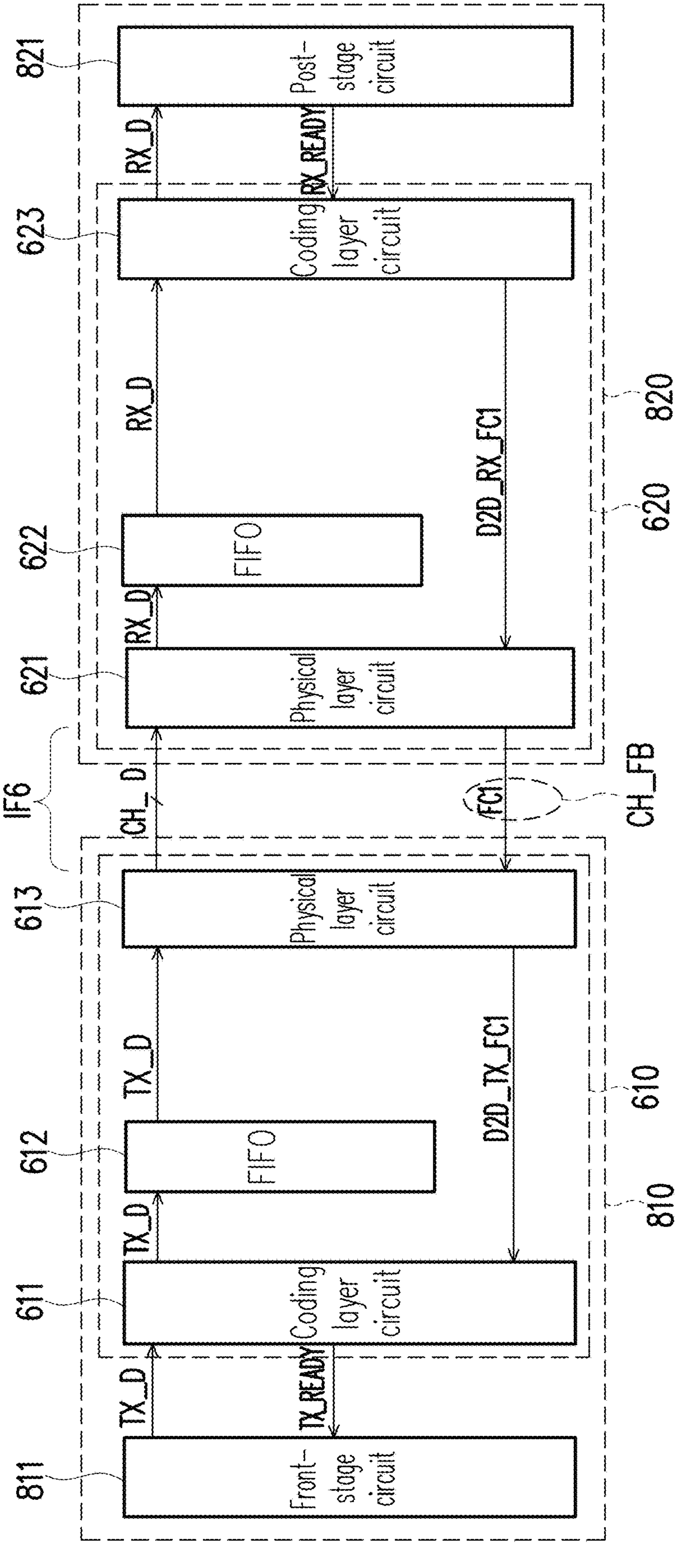
FIG. 8 is a schematic circuit block diagram of a transmitting device and a receiving device shown according to an embodiment of the invention.

FIG. 8 is a schematic circuit block diagram of the transmitting device 610 and the receiving device 620 shown according to an embodiment of the invention. As shown in FIG. 8, a die 810 and a die 820 are disposed in the same integrated circuit package, and the die 810 is coupled to the die 820 via the communication interface IF6. For example, the die 810 may be the SerDes die 120 and the die 820 may be the ASIC die 130. Alternatively, the die 810 and the die 820 may be analogized with reference to the related descriptions of the die 200, the dies 202, and/or the processor dies 200'. In the embodiment shown in FIG. 8, the transmission management information may include flow control information.

The die 810 shown in FIG. 8 includes a front-stage circuit 811 and the transmitting device 610. According to actual design, the front-stage circuit 811 may include a processor or other circuits/elements. The die 820 shown in FIG. 8 includes the receiving device 620 and a post-stage circuit 821. According to actual design, the post-stage circuit 821 may include a memory, a register, or other circuits/elements. The transmitting device 610 and the receiving device 620 shown in FIG. 8 may be used as one of many embodiments of the transmitting device 610 and the receiving device 620 shown in FIG. 6.

In the embodiment shown in FIG. 8, the feedback channel CH_FB includes a dedicated wire FC1. The dedicated wire FC1 is dedicated to reflect the full state of the data buffer of the receiving device 620. Based on actual design, in some embodiments, the data buffer of the response receiving device 620 may include a first-in-first-out (FIFO) buffer (such as a FIFO buffer 622 shown in FIG. 8) or other buffers. When the data buffer of the receiving device 620 is full (or about to be full), the receiving device 620 may notify the transmitting device 610 to suspend the transmission of the data unit stream via the dedicated wire FC1.

In the embodiment shown in FIG. 8, the transmitting device 610 includes a coding layer circuit 611, a FIFO (first-in-first-out) buffer 612, and a physical layer circuit 613. According to actual design, in some embodiments, the coding layer circuit 611 may include a physical coding sublayer (PCS) circuit and (or) other coding layer circuits. The coding layer circuit 611 may receive a plurality of data units of a data unit stream TX_D from the front-stage circuit 811 in the die 810 to transmit the data unit stream TX_D to the FIFO buffer 612. The FIFO buffer 612 is coupled to the coding layer circuit 611 to receive and temporarily store the data units of the data unit stream TX_D. The coding layer circuit 611 may manage the FIFO buffer 612. The physical layer circuit 613 is coupled to the FIFO buffer 612 to receive the data units of the data unit stream TX_D temporarily stored in the FIFO buffer 612. According to actual design, in some embodiments, the physical layer circuit 613 may include a physical medium attachment (PMA) circuit and (or) other physical layer circuits. The physical layer circuit 613 may fetch data units from the FIFO buffer 612 to transmit the data unit stream TX_D containing the data units to the receiving device 620 of the die 820 via the data channel CH_D in the communication interface IF6.

In the embodiment shown in FIG. 8, the receiving device 620 includes a physical layer circuit 621, a FIFO buffer 622 (data buffer), and a coding layer circuit 623. According to actual design, in some embodiments, the physical layer circuit 621 may include a physical medium attachment (PMA) circuit and (or) other physical layer circuits. The physical layer circuit 621 may receive the data unit stream from the data channel CH_D in the communication interface IF6 to transmit a data unit stream RX_D to the FIFO buffer 622. The FIFO buffer 622 is coupled to the physical layer circuit 621 to receive and temporarily store a plurality of data units of the data unit stream RX_D. The coding layer circuit 623 is coupled to the FIFO buffer 622. According to actual design, in some embodiments, the coding layer circuit 623 may include a physical coding sublayer (PCS) circuit and (or) other coding layer circuits. The coding layer circuit 623 may manage the FIFO buffer 622. Based on a ready signal RX_READY of the post-stage circuit 821 in the die 820, the coding layer circuit 623 fetches the data units from the FIFO buffer 622 to provide to the post-stage circuit 821. When the ready signal RX_READY indicates that the post-stage circuit 821 is not ready, the coding layer circuit 623 stops fetching data units from the FIFO buffer 622. At this time, the FIFO buffer 622 may still receive and temporarily store data units from the physical layer circuit 621.

When the FIFO buffer 622 (data buffer) of the receiving device 620 is full (or about to be full), the coding layer circuit 623 may send transmission management information D2D_RX_FC1 (e.g., single bit signal) to the physical layer circuit 621 to notify the transmitting device 610 to suspend the transmission of the data unit stream TX_D via the physical layer circuit 621 and the dedicated wire FC1. When the dedicated wire FC1 indicates that the FIFO buffer 622 of the receiving device 620 is full (or about to be full), the physical layer circuit 613 may output transmission management information D2D_TX_FC1 (e.g., single bit signal) to the coding layer circuit 611, and the coding layer circuit 611 may control the FIFO buffer 612 to suspend the output of data units. When the FIFO buffer 612 is full, the coding layer circuit 611 may notify the front-stage circuit 811 to suspend the supply of data units via a ready signal TX_READY.

Figure 9:
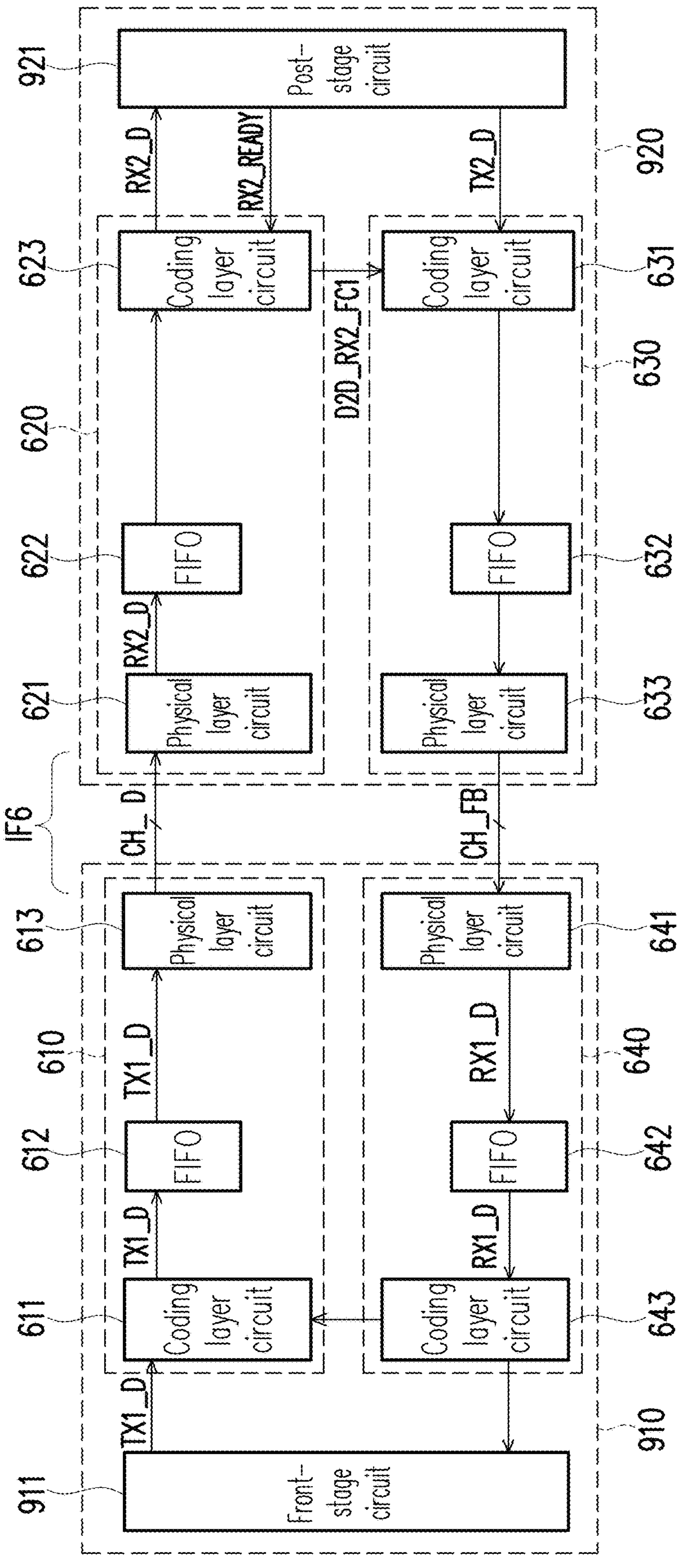
FIG. 9 is a schematic circuit block diagram of the dies according to an embodiment of the invention.

FIG. 9 is a schematic circuit block diagram of the die 910 and the die 920 according to an embodiment of the invention. In the embodiment shown in FIG. 9, the transmission management information may include flow control information. The flow control information represents readiness of the receiving device 620 of the die 920 to accept data like in the case of AXI Slave. The die 910 shown in FIG. 9 includes a front-stage circuit 911, a transmitting device 610 and a receiving device 640, and the die 920 shown in FIG. 9 includes a post-stage circuit 921, a transmitting device 630 and a receiving device 620. For the transmitting device 610 shown in FIG. 9, reference may be made to relevant descriptions of the transmitting device 610 shown in FIG. 6, and for the receiving device 620 shown in FIG. 9, reference may be made to relevant descriptions of the receiving device 620 shown in FIG. 6. In the embodiment shown in FIG. 9, the feedback channel CH_FB may be analogized with reference to the related descriptions of the data channel CH_D, so details are not repeated here.

In the embodiment shown in FIG. 9, the transmitting device 610 includes a coding layer circuit 611, a FIFO (first-in-first-out) buffer 612, and a physical layer circuit 613. The coding layer circuit 611 may receive a data unit stream TX1_D from the front-stage circuit 911 in the die 910 to transmit the data unit stream TX1_D to the FIFO buffer 612. The FIFO buffer 612 is coupled to the coding layer circuit 611 to receive and temporarily store the data units of the data unit stream TX1_D. The physical layer circuit 613 is coupled to the FIFO buffer 612 to receive the data units of the data unit stream TX1_D temporarily stored in the FIFO buffer 612. The physical layer circuit 613 may fetch data units from the FIFO buffer 612 to transmit the data unit stream TX1_D containing the data units to the receiving device 620 of the die 920 via the data channel CH_D in the communication interface IF6.

In the embodiment shown in FIG. 9, the receiving device 620 includes a physical layer circuit 621, a FIFO buffer 622, and a coding layer circuit 623. The physical layer circuit 621 may receive the data unit stream from the data channel CH_D in the communication interface IF6 to transmit a data unit stream RX2_D to the FIFO buffer 622. The FIFO buffer 622 is coupled to the physical layer circuit 621 to receive and temporarily store a plurality of data units of the data unit stream RX2_D. Based on a ready signal RX2_READY of the post-stage circuit 921 in the die 920, the coding layer circuit 623 fetches the data units from the FIFO buffer 622 to provide to the post-stage circuit 921. When the ready signal RX2_READY indicates that the post-stage circuit 921 is not ready, the coding layer circuit 623 stops fetching data units from the FIFO buffer 622. At this time, the FIFO buffer 622 may still receive and temporarily store data units from the physical layer circuit 621.

The transmitting device 630 transmits a data unit stream TX2_D to the feedback channel CH_FB in the communication interface IF6, wherein the data unit stream TX2_D comprises a plurality of data units transmitted by the die 920 to the die 910. The receiving device 640 is coupled to the transmitting device 630 via the communication interface IF6. The receiving device 640 receives the data unit stream RX1_D from the feedback channel CH_FB, wherein the transmission management information is transferred through at least one dedicated bit of every data unit of the second data unit stream TX2_D (RX1_D). In some embodiments, the plurality of data units are codewords, Flits or packets.

In the embodiment shown in FIG. 9, the transmitting device 630 includes a coding layer circuit 631, a FIFO (first-in-first-out) buffer 632, and a physical layer circuit 633. The coding layer circuit 631 may receive a data unit stream TX2_D from the post-stage circuit 921 to transmit the data unit stream TX2_D to the FIFO buffer 632. The data unit stream TX2_D comprises codewords or Flits transmitted by the die 920 to the die 910. The FIFO buffer 632 is coupled to the coding layer circuit 631 to receive and temporarily store the data units of the data unit stream TX2_D. The physical layer circuit 633 is coupled to the FIFO buffer 632 to receive the data units of the data unit stream TX2_D temporarily stored in the FIFO buffer 632. The physical layer circuit 633 may fetch data units from the FIFO buffer 632 to transmit the data unit stream TX2_D containing the data units to the receiving device 640 of the die 910 via the feedback channel CH_FB in the communication interface IF6. The coding layer circuit 631, the FIFO buffer 632, and the physical layer circuit 633 may be analogized with reference to the related descriptions of the coding layer circuit 611, the FIFO buffer 612, and the physical layer circuit 613, so details are not repeated here.

In the embodiment shown in FIG. 9, the receiving device 640 includes a physical layer circuit 641, a FIFO buffer 642, and a coding layer circuit 643. The physical layer circuit 641 may receive the data unit stream from the feedback channel CH_FB in the communication interface IF6 to transmit a data unit stream RX1_D to the FIFO buffer 642. The FIFO buffer 642 is coupled to the physical layer circuit 641 to receive and temporarily store a plurality of data units of the data unit stream RX1_D. The physical layer circuit 641, the FIFO buffer 642, and the coding layer circuit 643 may be analogized with reference to the related descriptions of the physical layer circuit 621, the FIFO buffer 622, and the coding layer circuit 623, so details are not repeated here.

When the FIFO buffer 622 of the receiving device 620 is full (or about to be full), the coding layer circuit 623 may send transmission management information D2D_RX2_FC1 (e.g., single bit signal) to the coding layer circuit 631 to notify the transmitting device 610 to suspend the transmission of the data unit stream TX1_D via the coding layer circuit 631, the FIFO buffer 632, the physical layer circuit 633, the feedback channel CH_FB, the physical layer circuit 641, the FIFO buffer 642, and the coding layer circuit 643. The transmission management information D2D_RX2_FC1 is transferred through at least one dedicated bit of every packet of the data unit stream TX2_D.

The coding layer circuit 611 observes the at least one dedicated bit of each packet of the data unit stream RX1_D through the coding layer circuit 643. When the at least one dedicated bit indicates that the FIFO buffer 622 of the receiving device 620 is full (or about to be full), the coding layer circuit 611 may control the FIFO buffer 612 to suspend the output of data units. When the FIFO buffer 612 is full, the coding layer circuit 611 may notify the front-stage circuit 911 to suspend the supply of data units.

Figure 10:
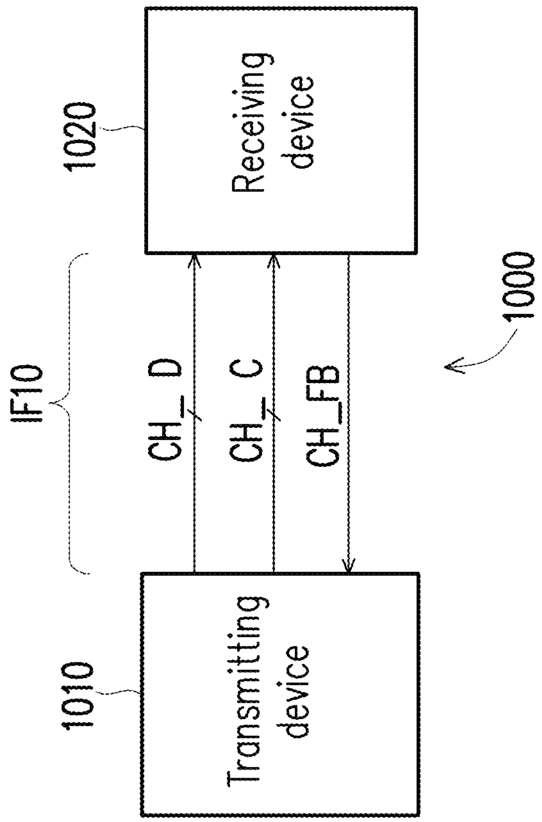
FIG. 10 is a schematic circuit block diagram of a die-to-die communication system according to another embodiment of the invention.

FIG. 10 is a schematic circuit block diagram of a die-to-die communication system 1000 according to another embodiment of the invention. The die-to-die communication system 1000 shown in FIG. 10 includes a transmitting device 1010 and a receiving device 1020. The transmitting device 1010 may be disposed at one die (first die), and the receiving device 1020 may be disposed at another die (second die). In particular, the first die and the second die are disposed in the same integrated circuit package, and the first die is coupled to the second die via a communication interface IF10. The die-to-die communication system 1000, the transmitting device 1010, the communication interface IF10, and the receiving device 1020 shown in FIG. 10 are as provided in the related descriptions of the die-to-die communication system 600, the transmitting device 610, the communication interface IF6, and the receiving device 620 shown in FIG. 6 and analogized.

In the embodiment shown in FIG. 10, the transmitting device 1010 disposed at the first die may transmit a data unit stream to the receiving device 1020 disposed at the second die via the data channel CH_D in the communication interface IF10. The transmitting device 1010 may calculate the original verification data of the current data unit in the data unit stream. In particular, the number of bits of the original verification data may be any integer determined according to actual design. In addition to sending the current data unit to the receiving device 1020 via the data channel CH_D, the transmitting device 1010 may also transmit the original verification data corresponding to the current data unit to the receiving device 1020 via a certification data channel CH_C different from the data channel CH_D and the feedback channel CH_FB in the communication interface IF10.

The receiving device 1020 may receive the current data unit from the data channel CH_D, and receive the original verification data corresponding to the current data unit from the certification data channel CH_C. The receiving device 1020 checks whether there is an error in the current data unit received from the data channel CH_D using the original verification data received from the certification data channel CH_C. In the embodiment shown in FIG. 10, the transmission management information may include error replay information. The error replay information represents that the current data unit received by the receiving device 1020 from the data channel CH_D is an error. When the current data unit received from the data channel CH_D is an error, the receiving device 1020 sends the error replay information to the transmitting device 1010 via the feedback channel CH_FB, so as to notify the transmitting device 1010 to retransmit the current data unit.

Based on the above, the transmitting device 1010 transmits the current data unit to the receiving device 1020 via the data channel CH_D, and transmits the original verification data corresponding to the current data unit to the receiving device 1020 via the certification data channel CH_C different from the data channel CH_D. Therefore, the transmission bandwidth of the data channel CH_D may be not occupied by the original verification data. The receiving device 1020 checks the current data unit based on the original verification data, and returns the checking result (transmission management information) to the transmitting device 1010 via the feedback channel CH_FB. Therefore, the transmission bandwidth of the data channel CH_D may be not occupied by the transmission management information. Since the feedback channel CH_FB is dedicated to the return of the transmission management information, the transmitting device 1010 may manage the data unit stream transmitted on the data channel CH_D in real time based on the transmission management information.

Figure 11:
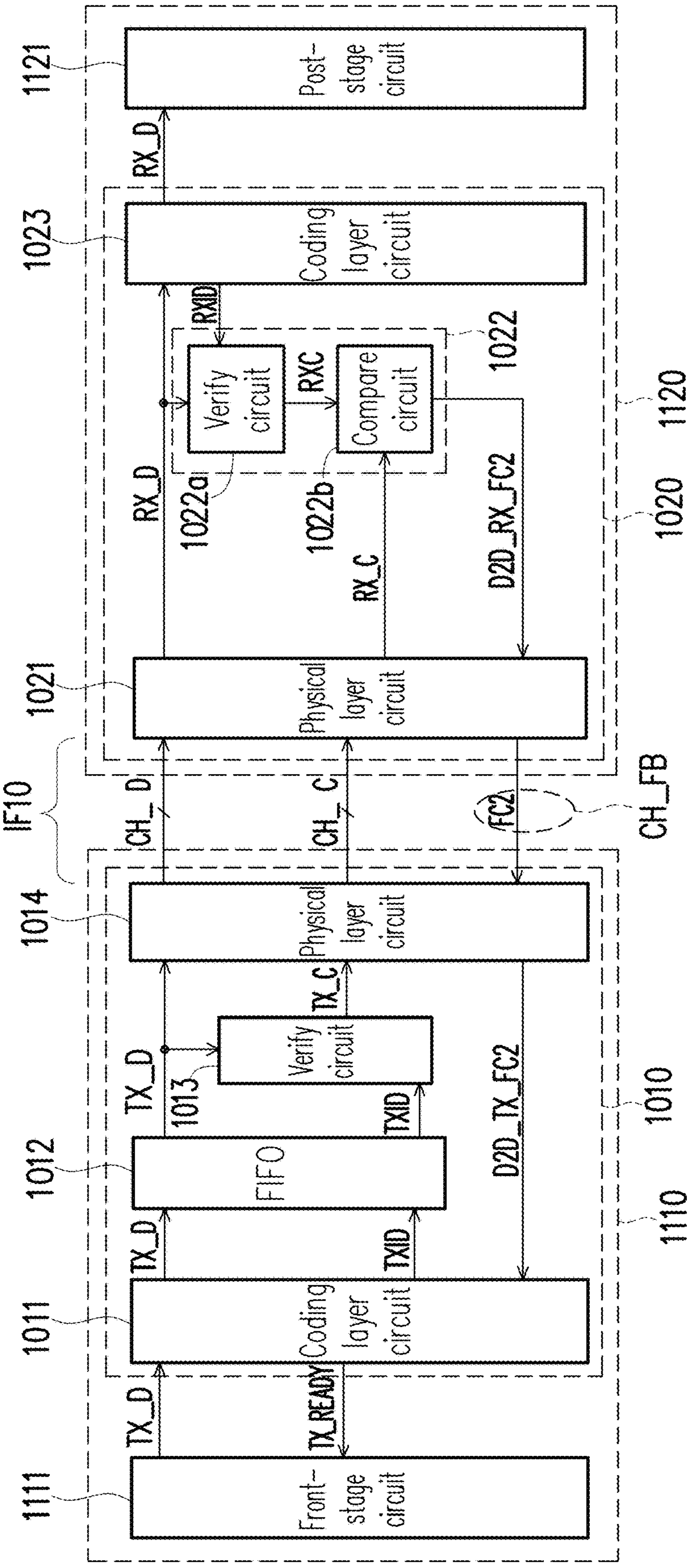
FIG. 11 is a schematic circuit block diagram of a transmitting device and a receiving device shown according to another embodiment of the invention.

FIG. 11 is a schematic circuit block diagram of the transmitting device 1010 and the receiving device 1020 shown according to an embodiment of the invention. As shown in FIG. 11, a die 1110 and a die 1120 are disposed in the same integrated circuit package, and the die 1110 is coupled to the die 1120 via the communication interface IF10. For example, the die 1110 may be the SerDes die 120 and the die 1120 may be the ASIC die 130. Alternatively, the die 1110 and the die 1120 may be analogized with reference to the related descriptions of the die 200, the dies 202, and/or the processor dies 200'. In the embodiment shown in FIG. 11, the transmission management information may include error replay information.

The die 1110 shown in FIG. 11 includes a front-stage circuit 1111 and the transmitting device 1010. According to actual design, the front-stage circuit 1111 may include a processor or other circuits/elements. The die 1120 shown in FIG. 11 includes the receiving device 1020 and a post-stage circuit 1121. According to actual design, the post-stage circuit 1121 may include a memory, a register, or other circuits/elements. The transmitting device 1010 and the receiving device 1020 shown in FIG. 11 may be used as one of many embodiments of the transmitting device 1010 and the receiving device 1020 shown in FIG. 10. In the embodiment shown in FIG. 11, the feedback channel CH_FB includes a dedicated wire FC2. The dedicated wire FC2 is dedicated to reflect that the current data unit is an error. When the current data unit received by the receiving device 1020 is an error, the receiving device 1020 may notify the transmitting device 1010 to retransmit the current data unit via the dedicated wire FC2.

In the embodiment shown in FIG. 11, the transmitting device 1010 includes the coding layer circuit 1011, the FIFO (first-in-first-out) buffer 1012, the verify circuit 1013, and the physical layer circuit 1014. The coding layer circuit 1011 may receive a plurality of data units of the data unit stream TX_D from the front-stage circuit 1111 in the die 1110 to transmit the data unit stream TX_D to the FIFO buffer 1012. The coding layer circuit 1011 may manage the FIFO buffer 1012. When the FIFO buffer 1012 is full, the coding layer circuit 1011 may notify the front-stage circuit 1111 to suspend the supply of data units via the ready signal TX_READY.

The coding layer circuit 1011 self-counts a current transmission data identification value TXID based on the data units in the data unit stream TX_D. The current transmission data identification value TXID is multi-bit data, and the number of bits of the current transmission data identification value TXID is an integer determined according to actual design. In some embodiments, the coding layer circuit 1011 may generate the current transmission data identification value TXID using a counter. For example, when the coding layer circuit 1011 generates the first data unit, the current transmission data identification value TXID is "1"; when the coding layer circuit 1011 generates the second data unit, the current transmission data identification value TXID is progressively "2"; and so on. Therefore, the current transmission data identification value TXID may be used as the index (or identification code) of the current data unit. In particular, the counting period of the counter of the coding layer circuit 1011 is equal to or greater than the depth of the FIFO buffer 1012.

The FIFO buffer 1012 is coupled to the coding layer circuit 1011 to receive and temporarily store the data units of the data unit stream TX_D and the corresponding data identification values, such as the current data unit and the current transmission data identification value TXID. The verify circuit 1013 is coupled to the FIFO buffer 1012. The verify circuit 1013 calculates original verification data TX_C corresponding to the current data unit using the current data unit and the current transmission data identification value TXID temporarily stored in the FIFO buffer 1012. According to actual design, in some embodiments, the verify circuit 1013 may include a cyclic redundancy check (CRC) circuit, a parity check circuit, or other verification/check calculation circuits. The physical layer circuit 1014 is coupled to the FIFO buffer 1012 to receive the data units of the data unit stream TX_D temporarily stored in the FIFO buffer 1012. The physical layer circuit 1014 is coupled to the verify circuit 1013 to receive the original verification data TX_C corresponding to the current data unit.

The physical layer circuit 1014 may fetch the current data unit from the FIFO buffer 1012 to transmit the current data unit to the receiving device 1020 of the die 1120 via the data channel CH_D in the communication interface IF10. The physical layer circuit 1014 transmits the original verification data TX_C corresponding to the current data unit to the receiving device 1020 via the certification data channel CH_C different from the data channel CH_D and the feedback channel CH_FB in the communication interface IF10.

In the embodiment shown in FIG. 11, the receiving device 1020 includes a physical layer circuit 1021, a check circuit 1022, and a coding layer circuit 1023. The physical layer circuit 1021 may receive the data unit stream RX_D from the data channel CH_D in the communication interface IF10, and receive the original verification data RX_C corresponding to the current data unit in the data unit stream RX_D from the certification data channel CH_C different from the data channel CH_D and the feedback channel CH_FB in the communication interface IF10. The coding layer circuit 1023 is coupled to the physical layer circuit

1021 to receive the current data unit of the data unit stream RX_D, so as to provide the data unit stream RX_D to the post-stage circuit 1121.

The coding layer circuit 1023 self-counts a receiving data identification value RXID based on the current data unit received from the physical layer circuit 1021. The receiving data identification value RXID is multi-bit data, and the number of bits of the receiving data identification value RXID is an integer determined according to actual design. In some embodiments, the coding layer circuit 1023 may use a counter to generate the receiving data identification value RXID. For example, when the coding layer circuit 1023 receives the first data unit, the receiving data identification value RXID is "1"; when the coding layer circuit 1023 receives the second data unit, the receiving data identification value RXID is progressively "2"; and so on. Therefore, the receiving data identification value RXID may be used as the index (or identification code) of the current data unit. In particular, the counting period of the counter of the coding layer circuit 1023 is consistent with the counting period of the counter of the coding layer circuit 1011.

During the initialization period before a plurality of data units are transmitted (that is, before the normal transmission period starts), the coding layer circuit 1011 of the transmitting device 1010 may transmit a synchronization signal to the coding layer circuit 1023 of the receiving device 1020, so that the receiving data identification value RXID of the receiving device 1020 may be synchronized with the current transmission data identification value TXID of the transmitting device 1010. During normal transmission, the current transmission data identification value TXID of the transmitting device 1010 is not transmitted to the receiving device 1020 to save transmission bandwidth between the transmitting device 1010 and the receiving device 1020.

The check circuit 1022 is coupled to the physical layer circuit 1021 to receive the current data unit (the data unit stream RX_D) and the original verification data RX_C. The check circuit 1022 is coupled to the coding layer circuit 1023 to receive the receiving data identification value RXID. The check circuit 1022 may use the receiving data identification value RXID and the original verification data RX_C to check whether the current data unit has an error. When the current data unit is an error, the check circuit 1022 may send transmission management information D2D_RX_FC2 (e.g., single bit signal) to the physical layer circuit 1021 to notify the transmitting device 1010 to retransmit the current data unit via the physical layer circuit 1021 and the dedicated wire FC2.

In the embodiment shown in FIG. 11, the check circuit 1022 includes a verify circuit **1022*a* and a compare circuit 1022*b*. The verify circuit 1022*a* is coupled to the physical layer circuit 1021 to receive the current data unit. The verify circuit 1022*a* is coupled to the coding layer circuit 1023 to receive the receiving data identification value RXID. The verify circuit 1022*a* calculates the current verification data RXC using the current data unit and the receiving data identification value RXID. According to actual design, in some embodiments, the verify circuit 1022*a*** may include a cyclic redundancy check (CRC) circuit, a parity check circuit, or other verification/check calculation circuits.

The compare circuit **1022*b* is coupled to the physical layer circuit 1021 to receive the original verification data RX_C. The compare circuit 1022*b* is coupled to the verify circuit 1022*a* to receive the current verification data RXC. The compare circuit 1022*b* compares the original verification data RX_C with the current verification data RXC. When the current verification data RXC does not match the original verification data RX_C, the compare circuit 1022*b* may send the transmission management information D2D_RX_FC2 to the physical layer circuit 1021, so as to notify the transmitting device 1010 to retransmit the current data unit via the physical layer circuit 1021 and the dedicated wire FC2. When the dedicated wire FC2 indicates that the current data unit is an error, the physical layer circuit 1014 of the transmitting device 1010 may output the transmission management information D2D_TX_FC2 (e.g., single bit signal) to the coding layer circuit 1011, and the coding layer circuit 1011 controls the FIFO buffer 1012 to retransmit the current data unit to the physical layer circuit 1014. Moreover, when the dedicated wire FC2 indicates that the current data unit is an error, the transmitting device 1010 may send a synchronization signal to the receiving device 1020 so that the receiving data identification value RXID of the receiving device 1020 may be synchronized with the current transmitted data identification value TXID output by the FIFO buffer 1012 of the transmitting device 1010**.

Figure 12:
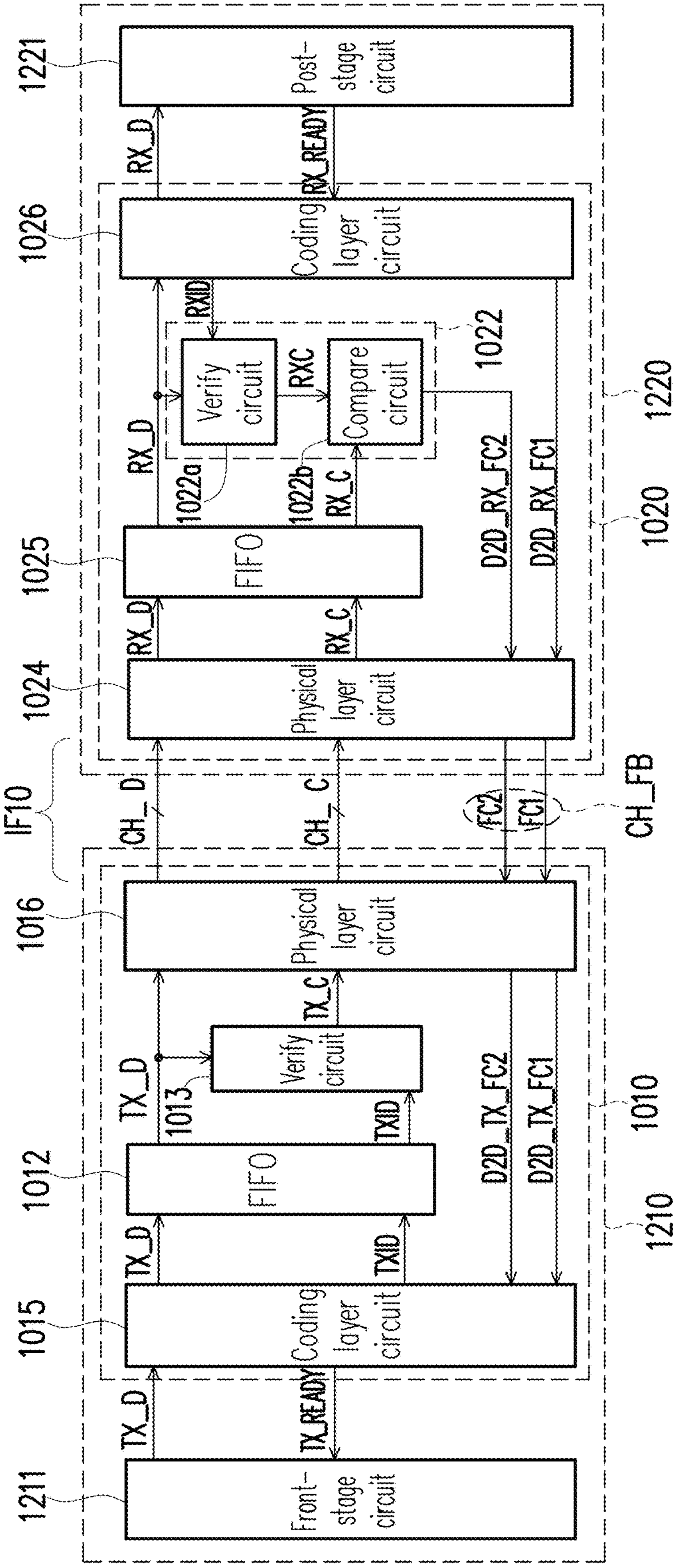
FIG. 12 is a schematic circuit block diagram of a transmitting device and a receiving device shown according to another embodiment of the invention.

FIG. 12 is a schematic circuit block diagram of the transmitting device 1010 and the receiving device 1020 shown according to another embodiment of the invention. As shown in FIG. 12, a die 1210 and a die 1220 are disposed in the same integrated circuit package, and the die 1210 is coupled to the die 1220 via the communication interface IF10. For example, the die 1210 may be the SerDes die 120 and the die 1220 may be the ASIC die 130. Alternatively, the die 1210 and the die 1220 may be analogized with reference to the related descriptions of the die 200, the dies 202, and/or the processor dies 200'. In the embodiment shown in FIG. 12, the transmission management information may include flow control information and error replay information.

The die 1210 shown in FIG. 12 includes a front-stage circuit 1211 and the transmitting device 1010. According to actual design, the front-stage circuit 1211 may include a processor or other circuits/elements. The die 1220 shown in FIG. 12 includes the receiving device 1020 and a post-stage circuit 1221. According to actual design, the post-stage circuit 1221 may include a memory, a register, or other circuits/elements. The transmitting device 1010 and the receiving device 1020 shown in FIG. 12 may be used as one of many embodiments of the transmitting device 1010 and the receiving device 1020 shown in FIG. 10. In the embodiment shown in FIG. 12, the feedback channel CH_FB includes the dedicated wire FC1 and the dedicated wire FC2. The dedicated wire FC1 is dedicated to reflect the full state of the data buffer of the receiving device 1020. Based on actual design, in some embodiments, the data buffer reflecting the receiving device 1020 may include a FIFO (first-in-first-out) buffer (such as a FIFO buffer 1025 shown in FIG. 12) or other buffers. When the data buffer of the receiving device 1020 is full (or about to be full), the receiving device 1020 may notify the transmitting device 1010 to suspend the transmission of the data unit stream via the dedicated wire FC1. The dedicated wire FC2 is dedicated to reflect that the current data unit is an error. When the current data unit received by the receiving device 1020 is an error, the receiving device 1020 may notify the transmitting device 1010 to retransmit the current data unit via the dedicated wire FC2.

In the embodiment shown in FIG. 12, the transmitting device 1010 includes a coding layer circuit 1015, the FIFO (first-in-first-out) buffer 1012, the verify circuit 1013, and a physical layer circuit 1016. The coding layer circuit 1015 may receive a plurality of data units of the data unit stream TX_D from the front-stage circuit 1211 in the die 1210 to transmit the data unit stream TX_D to the FIFO buffer 1012.

The coding layer circuit 1015 self-counts the current transmission data identification value TXID based on the data units in the data unit stream TX_D. The FIFO buffer 1012 is coupled to the coding layer circuit 1015 to receive and temporarily store the data units of the data unit stream TX_D and the corresponding data identification values, such as the current data unit and the current transmission data identification value TXID. The coding layer circuit 1015 may manage the FIFO buffer 1012. When the FIFO buffer 1012 is full, the coding layer circuit 1015 may notify the front-stage circuit 1211 to suspend the supply of data units via the ready signal TX_READY.

The physical layer circuit 1016 is coupled to the FIFO buffer 1012 to receive the data units of the data unit stream TX_D temporarily stored in the FIFO buffer 1012. The physical layer circuit 1016 may fetch the current data unit from the FIFO buffer 1012 to transmit the data unit stream TX_D containing the current data unit to the receiving device 1020 of the die 1220 via the data channel CH_D in the communication interface IF10. The coding layer circuit 1015, the FIFO buffer 1012, the verify circuit 1013, and the physical layer circuit 1016 shown in FIG. 12 are as provided in the related descriptions of the coding layer circuit 1011, the FIFO buffer 1012, the verify circuit 1013, and the physical layer circuit 1014 shown in FIG. 11 and are therefore not repeated herein. The physical layer circuit 1016 transmits the original verification data TX_C corresponding to the current data unit to the receiving device 1020 via the certification data channel CH_C different from the data channel CH_D and the feedback channel CH_FB in the communication interface IF10.

In the embodiment shown in FIG. 12, the receiving device 1020 includes the physical layer circuit 1024, a FIFO buffer 1025 (data buffer), the check circuit 1022, and a coding layer circuit 1026. The physical layer circuit 1024 receives a current data unit in the plurality of data units of the data unit stream from the data channel CH_D in the communication interface IF10. The physical layer circuit 1024 receives the original verification data RX_C corresponding to the current data unit from the certification data channel CH_C. The FIFO buffer 1025 is coupled to the physical layer circuit 1024 to receive and temporarily store the data unit stream. The coding layer circuit 1026 is coupled to the FIFO buffer 1025 to receive the current data unit. The coding layer circuit 1026 may manage the FIFO buffer 1025. The coding layer circuit 1026 fetches data units from the FIFO buffer 1025 based on the ready signal RX_READY of the post-stage circuit 1221 in the die 1220 to provide to the post-stage circuit 1221. The coding layer circuit 1026 self-counts the receiving data identification value RXID based on the current data unit received from the physical layer circuit 1024.

The check circuit 1022 is coupled to the FIFO buffer 1025 to receive the current data unit and the original verification data RX_C. The check circuit 1022 is coupled to the coding layer circuit 1026 to receive the receiving data identification value RXID. The check circuit 1022 checks whether the current data unit has an error using the receiving data identification value RXID and the original verification data RX_C. When the current data unit is an error, the check circuit 1022 may send the transmission management information D2D_RX_FC2 to the physical layer circuit 1024 to notify the transmitting device 1010 to retransmit the current data unit via the physical layer circuit 1024 and the dedicated wire FC2. When the dedicated wire FC2 indicates that the current data unit is an error, the physical layer circuit 1016 of the transmitting device 1010 may output the transmission management information D2D_TX_FC2 to the coding layer circuit 1015, and the coding layer circuit 1015 controls the FIFO buffer 1012 to retransmit the current data unit to the physical layer circuit 1016. The coding layer circuit 1015, the FIFO buffer 1012, the verify circuit 1013, the physical layer circuit 1016, the physical layer circuit 1024, the check circuit 1022, and the coding layer circuit 1026 shown in FIG. 12 are as provided in the related descriptions of the coding layer circuit 1011, the FIFO buffer 1012, the verify circuit 1013, the physical layer circuit 1014, the physical layer circuit 1021, the check circuit 1022, and the coding layer circuit 1023 shown in FIG. 11.

When the ready signal RX_READY indicates that the post-stage circuit 1221 is not ready, the coding layer circuit 1026 of the receiving device 1020 shown in FIG. 12 stops fetching data units from the FIFO buffer 1025. At this time, the FIFO buffer 1025 may still receive and temporarily store data units from the physical layer circuit 1024. When the FIFO buffer 1025 is full (or about to be full), the coding layer circuit 1026 may send the transmission management information D2D_RX_FC1 to the physical layer circuit 1024 to notify the transmitting device 1010 to suspend the transmission of the data unit stream via the physical layer circuit 1024 and the dedicated wire FC1. When the dedicated wire FC1 indicates that the FIFO buffer 1025 (data buffer) of the receiving device 1020 is full, the physical layer circuit 1016 of the transmitting device 1010 may output the transmission management information D2D_TX_FC1 to the coding layer circuit 1015, and the coding layer circuit 1015 controls the FIFO buffer 1012 to suspend the output of the data units. When the FIFO buffer 1012 is full, the coding layer circuit 1015 notifies the front-stage circuit 1211 to suspend the supply of data units. The coding layer circuit 1015, the FIFO buffer 1012, the physical layer circuit 1016, the physical layer circuit 1024, the FIFO buffer 1025 (data buffer), and the coding layer circuit 1026 shown in FIG. 12 are as provided in the related descriptions of the coding layer circuit 611, the FIFO buffer 612, the physical layer circuit 613, the physical layer circuit 621, the FIFO buffer 622, and the coding layer circuit 623 shown in FIG. 8.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A die-to-die communication system, comprising:

a first transmitting device disposed at a first die for transmitting a first data unit stream to a data channel in a communication interface; and a first receiving device disposed at a second die, wherein the first die and the second die are disposed in a same integrated circuit package, the first receiving device is coupled to the first transmitting device via the communication interface, the first receiving device receives the first data unit stream from the data channel in the communication interface, the first receiving device returns transmission management information to the first transmitting device via a feedback channel different from the data channel in the communication interface, and the first transmitting device manages the first data unit stream of the data channel based on the transmission management information, wherein the feedback channel comprises a first dedicated wire dedicated to reflect that a current data unit is an error, and when the current data unit received by the first receiving device is an error, the first receiving device notifies the first transmitting device to retransmit the current data unit via the first dedicated wire.

2. The die-to-die communication system of claim 1, wherein the transmission management information comprises error replay information representing that the current data unit received by the first receiving device from the data channel is an error, and when the current data unit received from the data channel is an error, the first receiving device sends the error replay information to the first transmitting device via the feedback channel, so as to notify the first transmitting device to retransmit the current data unit.

3. The die-to-die communication system of claim 1, wherein, the first transmitting device calculates original verification data of a current data unit in a plurality of data units of the first data unit stream, and the first transmitting device transmits the original verification data corresponding to the current data unit to the first receiving device via a certification data channel different from the data channel and the feedback channel in the communication interface;

the first receiving device receives the current data unit from the data channel in the communication interface, the first receiving device receives the original verification data corresponding to the current data unit from the certification data channel in the communication interface, and the first receiving device checks whether the current data unit received from the data channel has an error using the original verification data received from the certification data channel; and when the current data unit received from the data channel is an error, the first receiving device notifies the first transmitting device to retransmit the current data unit via the first dedicated wire.

4. The die-to-die communication system of claim 1, wherein the first transmitting device comprises:

a coding layer circuit for receiving a plurality of data units of the first data unit stream from a front-stage circuit in the first die and self-counting a current transmission data identification value based on the current data unit in the data units;

a first-in-first-out buffer coupled to the coding layer circuit to receive and temporarily store the current data unit and the current transmission data identification value;

a verify circuit coupled to the first-in-first-out buffer, wherein the verify circuit calculates original verification data using the current data unit and the current transmission data identification value temporarily stored in the first-in-first-out buffer; and a physical layer circuit, coupled to the first-in-first-out buffer to receive the data units of the first data unit stream, and coupled to the verify circuit to receive the original verification data corresponding to the current data unit, wherein the physical layer circuit fetches the current data unit from the first-in-first-out buffer to transmit the current data unit to the first receiving device via the data channel in the communication interface, and the physical layer circuit transmits the original verification data corresponding to the current data unit to the first receiving device via a certification data channel different from the data channel and the feedback channel in the communication interface.

5. The die-to-die communication system of claim 4, wherein when the first dedicated wire indicates that the current data unit is an error, the coding layer circuit controls the first-in-first-out buffer to retransmit the current data unit to the physical layer circuit.

6. The die-to-die communication system of claim 4, wherein the verify circuit comprises a cyclic redundancy check circuit or a parity check circuit.

7. The die-to-die communication system of claim 1, wherein the first receiving device comprises:

a physical layer circuit for receiving the current data unit from the data channel in the communication interface and receiving original verification data corresponding to the current data unit from a certification data channel different from the data channel and the feedback channel in the communication interface;

a coding layer circuit coupled to the physical layer circuit to receive the current data unit, wherein the coding layer circuit self-counts a receiving data identification value based on the current data unit received from the physical layer circuit; and a check circuit, coupled to the physical layer circuit to receive the current data unit and the original verification data, and coupled to the coding layer circuit to receive the receiving data identification value, wherein the check circuit checks whether the current data unit has an error using the receiving data identification value and the original verification data, and when the current data unit is an error, the check circuit notifies the first transmitting device to retransmit the current data unit via the physical layer circuit and the first dedicated wire.

8. The die-to-die communication system of claim 7, wherein the check circuit comprises:

a verify circuit, coupled to the physical layer circuit to receive the current data unit, and coupled to the coding layer circuit to receive the receiving data identification value, wherein the verify circuit calculates current verification data using the current data unit and the receiving data identification value; and a compare circuit, coupled to the physical layer circuit to receive the original verification data, and coupled to the verify circuit to receive the current verification data, wherein the compare circuit compares the original verification data with the current verification data, and when the current verification data does not match the original verification data, the compare circuit notifies the first transmitting device to retransmit the current data unit via the physical layer circuit and the first dedicated wire.

9. The die-to-die communication system of claim 1, wherein the feedback channel further comprises a second dedicated wire, the second dedicated wire is dedicated to reflect a full state of a data buffer of the first receiving device, and when the data buffer of the first receiving device is full, the first receiving device notifies the first transmitting device to suspend a transmission of the first data unit stream via the second dedicated wire.

10. The die-to-die communication system of claim 9, wherein the first transmitting device comprises:

a coding layer circuit for receiving a plurality of data units of the first data unit stream from a front-stage circuit in the first die and self-counting a current transmission data identification value based on the current data unit in the data units;

a first-in-first-out buffer coupled to the coding layer circuit to receive and temporarily store the data units of the first data unit stream, wherein the coding layer circuit manages the first-in-first-out buffer;

a verify circuit coupled to the first-in-first-out buffer, wherein the verify circuit calculates original verification data using the current data unit and the current transmission data identification value temporarily stored in the first-in-first-out buffer; and a physical layer circuit, coupled to the first-in-first-out buffer to receive the data units of the first data unit stream, and coupled to the verify circuit to receive the original verification data corresponding to the current data unit, wherein the physical layer circuit fetches the data units from the first-in-first-out buffer to transmit the current data unit to the first receiving device via the data channel in the communication interface, and the physical layer circuit transmits the original verification data corresponding to the current data unit to the first receiving device via a certification data channel different from the data channel and the feedback channel in the communication interface, wherein, when the second dedicated wire indicates that the data buffer of the first receiving device is full, the coding layer circuit controls the first-in-first-out buffer to suspend an output of the data units;

when the first-in-first-out buffer is full, the coding layer circuit notifies the front-stage circuit to suspend a supply of the data units; and when the first dedicated wire indicates that the current data unit is an error, the coding layer circuit controls the first-in-first-out buffer to retransmit the current data unit to the physical layer circuit.

11. The die-to-die communication system of claim 9, wherein the first receiving device comprises:

a physical layer circuit for receiving the current data unit in a plurality of data units of the first data unit stream from the data channel in the communication interface and receiving original verification data corresponding to the current data unit from a certification data channel different from the data channel and the feedback channel in the communication interface;

the data buffer coupled to the physical layer circuit to receive and temporarily store the first data unit stream;

a coding layer circuit coupled to the data buffer to receive the current data unit, wherein the coding layer circuit manages the data buffer, and the coding layer circuit fetches the data units from the data buffer based on a ready signal of a post-stage circuit in the second die to provide to the post-stage circuit, and the coding layer circuit self-counts a receiving data identification value based on the current data unit received from the physical layer circuit; and a check circuit, coupled to the data buffer to receive the current data unit and the original verification data, and coupled to the coding layer circuit to receive the receiving data identification value, wherein the check circuit checks whether the current data unit has an error using the receiving data identification value and the original verification data, wherein, when the current data unit is an error, the check circuit notifies the first transmitting device to retransmit the current data unit via the physical layer circuit and the first dedicated wire; and when the data buffer of the first receiving device is full, the coding layer circuit notifies the first transmitting device to suspend a transmission of the first data unit stream via the physical layer circuit and the second dedicated wire.

12. An operation method of a die-to-die communication system, comprising:

transmitting a first data unit stream to a data channel in a communication interface by a first transmitting device disposed at a first die;

receiving the first data unit stream from the data channel in the communication interface by a first receiving device disposed at a second die, wherein the first die and the second die are disposed in a same integrated circuit package, and the first receiving device is coupled to the first transmitting device via the communication interface;

returning transmission management information to the first transmitting device via a feedback channel different from the data channel in the communication interface by the first receiving device, wherein the feedback channel comprises a first dedicated wire dedicated to reflect that a current data unit is an error; and managing the first data unit stream of the data channel based on the transmission management information by the first transmitting device; and notifying the first transmitting device to retransmit the current data unit via the first dedicated wire by the first receiving device when the current data unit received by the first receiving device is an error.

13. The operation method of claim 12, wherein the transmission management information comprises error replay information, the error replay information represents that the current data unit received by the first receiving device from the data channel is an error, and the operation method further comprises:

when the current data unit received from the data channel is an error, sending the error replay information to the first transmitting device via the feedback channel by the first receiving device, so as to notify the first transmitting device to retransmit the current data unit.

14. The operation method of claim 12, further comprising:

calculating original verification data of a current data unit in a plurality of data units of the first data unit stream by the first transmitting device;

transmitting the original verification data corresponding to the current data unit to the first receiving device via a certification data channel different from the data channel and the feedback channel in the communication interface by the first transmitting device;

receiving the current data unit from the data channel in the communication interface by the first receiving device;

receiving the original verification data corresponding to the current data unit from the certification data channel in the communication interface by the first receiving device;

checking whether there is an error in the current data unit received from the data channel using the original verification data received from the certification data channel by the first receiving device; and notifying the first transmitting device to retransmit the current data unit via the first dedicated wire by the first receiving device when the current data unit received from the data channel is an error.

15. The operation method of claim 12, further comprising:

receiving a plurality of data units of the first data unit stream from a pre-stage circuit in the first die by a coding layer circuit of the first transmitting device;

self-counting a current transmission data identification value based on the current data unit in the data units by the coding layer circuit;

recording the current data unit and the current transmission data identification value by a first-in-first-out buffer of the first transmitting device;

calculating original verification data using the current data unit and the current transmission data identification value temporarily stored in the first-in-first-out buffer by a verify circuit of the first transmitting device;

fetching the current data unit from the first-in-first-out buffer by a physical layer circuit of the first transmitting device, so as to transmit the current data unit to the first receiving device via the data channel in the communication interface; and transmitting the original verification data corresponding to the current data unit to the first receiving device via a certification data channel different from the data channel and the feedback channel in the communication interface by the physical layer circuit.

16. The operation method of claim 15, further comprising:

controlling the first-in-first-out buffer to retransmit the current data unit to the physical layer circuit by the coding layer circuit when the first dedicated wire indicates that the current data unit is an error.

17. The operation method of claim 15, wherein the verify circuit comprises a cyclic redundancy check circuit or a parity check circuit.

18. The operation method of claim 12, further comprising:

receiving the current data unit from the data channel in the communication interface by a physical layer circuit of the first receiving device;

receiving original verification data corresponding to the current data unit from a certification data channel different from the data channel and the feedback channel in the communication interface by the physical layer circuit;

self-counting a receiving data identification value based on the current data unit received from the physical layer circuit by a coding layer circuit of the first receiving device;

checking whether the current data unit has an error using the receiving data identification value and the original verification data by a check circuit of the first receiving device; and notifying the first transmitting device to retransmit the current data unit via the physical layer circuit and the first dedicated wire by the check circuit when the current data unit is an error.

19. The operation method of claim 18, further comprising:

calculating current verification data using the current data unit and the receiving data identification value by a verify circuit of the check circuit;

comparing the original verification data with the current verification data by a compare circuit of the check circuit; and notifying the first transmitting device to retransmit the current data unit via the physical layer circuit and the first dedicated wire by the compare circuit when the current verification data does not match the original verification data.

20. The operation method of claim 12, wherein the feedback channel comprises a second dedicated wire, the second dedicated wire is dedicated to reflect a full state of a data buffer of the first receiving device, and the operation method further comprises:

notifying the first transmitting device to suspend a transmission of the first data unit stream via the second dedicated wire by the first receiving device when the data buffer of the first receiving device is full.

* * * * *